United States Patent
Krivokapic et al.

(10) Patent No.: US 8,374,283 B2
(45) Date of Patent: *Feb. 12, 2013

(54) LOCAL OSCILLATOR WITH INJECTION PULLING SUPPRESSION AND SPURIOUS PRODUCTS FILTERING

(75) Inventors: Ivan Krivokapic, San Diego, CA (US); Thierry Divel, Varces (FR)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

This patent is subject to a terminal disclaimer.

(21) Appl. No.: 13/031,992

(22) Filed: Feb. 22, 2011

(65) Prior Publication Data

US 2011/0140760 A1 Jun. 16, 2011

Related U.S. Application Data

(63) Continuation of application No. 11/247,822, filed on Oct. 11, 2005, now Pat. No. 7,949,072.

(51) Int. Cl.
*H04L 27/12* (2006.01)
(52) U.S. Cl. ........ 375/306; 375/259; 375/295; 375/299; 375/302; 375/316
(58) Field of Classification Search .................. 375/215, 375/271, 285, 295, 301, 302, 306, 311, 322, 375/350, 354, 342
See application file for complete search history.

(56) References Cited

U.S. PATENT DOCUMENTS

| | | | |
|---|---|---|---|
| 4,056,163 A | 11/1977 | Wood et al. | |
| 5,060,297 A | 10/1991 | Ma et al. | |
| 6,163,685 A * | 12/2000 | Dilling et al. | 455/247.1 |
| 6,549,590 B2 * | 4/2003 | Myers et al. | 375/344 |
| 7,085,548 B1 | 8/2006 | Kluge et al. | |
| 7,424,271 B2 | 9/2008 | Shih et al. | |
| 7,522,691 B2 * | 4/2009 | Katakura | 375/376 |
| 7,551,127 B2 * | 6/2009 | Dubash et al. | 342/357.72 |
| 2003/0040292 A1 | 2/2003 | Peterzell et al. | |
| 2004/0086057 A1 | 5/2004 | Lee et al. | |
| 2004/0125240 A1 * | 7/2004 | Stikvoort et al. | 348/731 |
| 2005/0024544 A1 * | 2/2005 | Waight et al. | 348/731 |
| 2005/0041724 A1 | 2/2005 | Chansarkar | |
| 2005/0172718 A1 | 8/2005 | Kalinin et al. | |
| 2006/0038925 A1 | 2/2006 | Krug et al. | |
| 2006/0246861 A1 | 11/2006 | Dosanjh et al. | |
| 2006/0252396 A1 | 11/2006 | Barak et al. | |
| 2006/0274215 A1 | 12/2006 | Tseng et al. | |
| 2007/0066267 A1 * | 3/2007 | Ashby et al. | 455/314 |
| 2008/0191313 A1 * | 8/2008 | Rofougaran et al. | 257/532 |
| 2009/0311978 A1 | 12/2009 | Jensen | |

OTHER PUBLICATIONS

"Fractional/Integer-N- PLL Basics", Wireless Communication Busines Unit, Texas Instruments Technical Brief SWRA029, Aug. 1999.

\* cited by examiner

*Primary Examiner* — Hirdepal Singh
(74) *Attorney, Agent, or Firm* — Coats & Bennett, PLLC

(57) ABSTRACT

A single sideband mixer circuit includes a voltage controlled oscillator operable a tunable frequency f1. The mixer circuit outputs a frequency signal at a frequency $f1 \pm f2$. A tracking filter operates to filter the frequency signal and generate a first output signal at the frequency $f1 \pm f2$. A resonance frequency fr of the tracking filter is tunable to substantially match the frequency $f1 \pm f2$ of the frequency signal. The output signal of the tracking filter may be processed by a phase lock loop circuit to generate a control signal for controlling the setting of the tunable frequency f1 and resonance frequency fr. Alternatively, the output signal of the tracking filter may be divided and the divided signal processed by a phase lock loop circuit to generate the control signal for controlling setting of the tunable frequency f1 and resonance frequency fr.

18 Claims, 4 Drawing Sheets

LOCAL OSCILLATOR WITH INJECTION PULLING SUPPRESSION AND SPURIOUS PRODUCTS FILTERING

CROSS-REFERENCE

This application is a continuation of U.S. patent application Ser. No. 11/247,822 of the same title filed Oct. 11, 2005, the disclosure of which is hereby incorporated by reference.

BACKGROUND

1. Technical Field

The present invention relates to local oscillators and, in particular, to phase locked loop and direct conversion circuits using a local oscillator.

2. Description of Related Art

The increased demand in the wireless phone industry for highly integrated small form factor transmitter application specific integrated circuits (ASIC) requiring low external component count constrains the choice of possible implementation architectures. One very often used transmitter architecture that meets this requirement is based on direct conversion.

Direct conversion transmitters suffer from a phenomenon called Local Oscillator (LO) injection pulling. The oscillator in the frequency synthesizer operates at the same frequency as, or an integer multiple of, the transmitter output frequency. Due to limited reverse isolation, the transmitted output signal, or its harmonics, couple to the LO and seriously degrade its performance.

There are several ways to handle reverse modulation. One of the approaches to suppress reverse modulation is to improve printed circuit board (PCB) layout, decoupling and shielding. Although this approach seems to be simple, repeatability can be an issue. A fractional PLL based transmitter design is a second option. This solution improves local oscillator injection pulling, but does not completely eliminate the LO injection pulling effect. Another solution includes deployment of the "offset" LO scheme where the LO operates at frequency that is not harmonically related to a frequency that is intentionally radiated by transmitter. Because of this, the "offset" LO scheme is immune to injection pulling.

A particular problem with offset LO schemes concerns the presence of unwanted spurious response due to mixing. A need exists in the art for an offset LO scheme with improved spurious noise filtering.

SUMMARY

In accordance with an embodiment, a circuit comprises a voltage controlled oscillator having a control voltage input and generating a frequency signal at a frequency f1 set at least in part by the control voltage input. A polyphase filter circuit receives the frequency signal and generates first and second +45/−45 degree offset signals at the frequency f1. A first divider circuit receives the frequency signal at frequency f1 and generates quadrature signals at a divided down frequency f2. A quadrature mixer circuit receives the first and second +45/−45 degree offset signals and the quadrature signals to generate a mixed signal at a frequency f1±f2 (along with some other higher order mixing products). An included tracking filter is operable to filter the mixed signal and output a first VCO output signal at a frequency f1±f2 wherein a resonance frequency fr of the tracking filter is tunable with changes in frequency setting of the voltage controlled oscillator to substantially match the frequency f1±f2 of the mixed signal.

In accordance with another embodiment, a circuit comprises a single sideband mixer circuit including a voltage controlled oscillator operable at a tunable frequency f1. The mixer circuit outputs a frequency signal at a frequency f1±f2 (along with some other higher order mixing products). A tracking filter is operable to filter the frequency signal and generate a first output signal at the frequency f1±f2. A resonance frequency fr of the tracking filter is tunable with changes in tuning of the voltage controlled oscillator to substantially match the frequency f1±f2 of the frequency signal.

In accordance with another embodiment, a circuit comprises a signal generator including a voltage controlled oscillator that is operable at a tunable frequency. The signal generator outputs a frequency signal at a frequency f which is a function of the tunable frequency. A tracking filter is operable to filter the frequency signal and generate an output signal at the frequency f. A resonance frequency fr of the tracking filter is tunable with changes in tuning of the voltage controlled oscillator to substantially match the frequency f of the frequency signal.

BRIEF DESCRIPTION OF THE DRAWINGS

A more complete understanding of the invention may be obtained by reference to the accompanying drawings wherein.

DETAILED DESCRIPTION OF THE DRAWINGS

Figure 1:
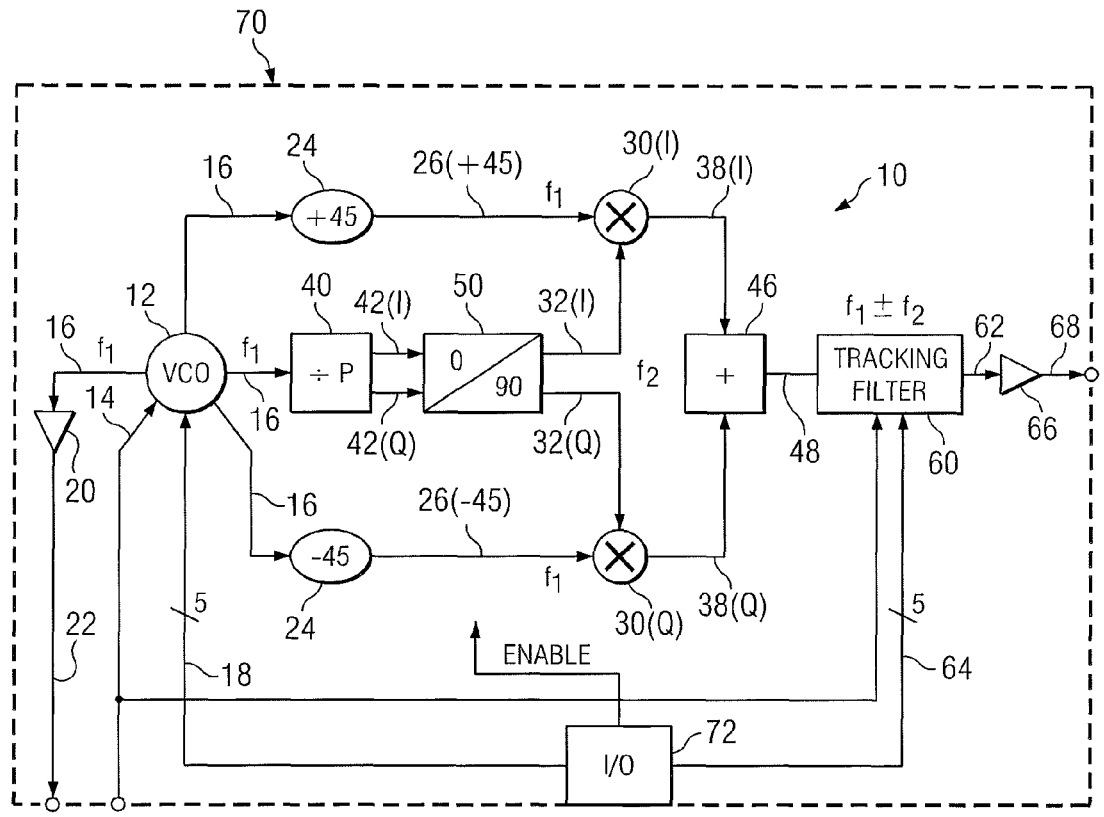
FIG. 1 is a block diagram of a voltage controlled oscillator circuit.

Reference is now made to FIG. 1 wherein there is shown a block diagram of a voltage controlled oscillator circuit 10. The voltage controlled oscillator circuit 10 has a number of applications including as a local oscillator (LO) in a frequency down/up-conversion process (which may comprise direct conversion and/or intermediate conversion transmitters and receivers). The voltage controlled oscillator circuit 10 may be implemented in a phase lock loop (PLL) circuit as shown in an exemplary manner in FIGS. 3 and 4.

The voltage controlled oscillator circuit 10 includes a voltage controlled oscillator 12. In an exemplary implementation, the voltage controlled oscillator (VCO) 12 may generate an output signal 16/22 having a frequency f1 in the range of between about 2.1 and 2.6 GHz (for example, for use as a local oscillator in a CDMA cellular mobile telephone application). It will, of course, be understood that the voltage controlled oscillator 12 can be designed by one skilled in the art to operate over any desired frequency range depending on its desired application. The voltage controlled oscillator 12 receives an analog voltage (fine) tuning signal 14 and operates to generate an output signal 16 at the frequency f1 that is a function of the magnitude of the tuning signal 14. The voltage controlled oscillator 12 further receives a digital calibration signal 18 and operates to coarse tune the frequency f1 of the output signal 16 as a function of the specified digital signal 18 calibration value. As an example, with a fine analog voltage tuning signal 14 value of 0.5 V, the voltage controlled oscillator 12 may generate the output signal with a frequency range of about 1.9 to 2.7 GHz selectively settable over a plurality of steps (for example, $2^5$ steps for a 5 bit calibration signal) defined by the coarse tuning calibration value of the digital signal 18. With a fine analog voltage tuning signal 14 value of 1.5 V, on the other hand, the voltage controlled oscillator 12 may generate the output signal with a frequency range of about 2.0 to 2.8 GHz with the same selectively settable plurality of steps defined by the coarse tuning calibration value of the digital signal 18. In a preferred implementation, the voltage controlled oscillator 12 utilizes a capacitance-based calibrator (for example, through the use of switching capacitors) to support accurate tuning so as to place the operation frequency f1 well tuned on the desired frequency.

The voltage controlled oscillator 12 output signal 16 is provided to an output amplifier buffer 20 having a frequency range comparable to the output signal 16 frequency f1 of the voltage controlled oscillator (for example, about 2.1 to 2.6 GHz). The generated buffered output signal 22 can then be used for any selected local oscillator-related purpose (such as the cellular local oscillator application discussed above). If desired, a polyphase filter 23 could be provided in any of the illustrated embodiments connected to the buffer 20 to generate quadrature signals 22(I) and 22(Q) for output.

The voltage controlled oscillator 12 output signal 16 is further provided to a polyphase filter circuit 24. A first part 24(+45) of the circuit 24 introduces a +45° phase shift in the voltage controlled oscillator 12 output signal 16 to produce signal 26(+45) at the frequency f1. A second part 24(−45) of the circuit 24 introduces a −45° phase shift in the voltage controlled oscillator 12 output signal 16 to produce signal 26(−45) also at the frequency f1.

The circuit 10 further includes a quadrature mixer 30. An in-phase (I) mixer component 30(I) receives the f1 signal 26(+45) from the first part 24(+45) of the circuit 24 at a first input and an in-phase (I) local oscillator signal 32(I) at a frequency f2 at a second input. A quadrature phase (Q) mixer component 30(Q) receives the f1 signal 26(−45) from the second part 24(−45) of the circuit 24 at a first input and a quadrature phase (Q) local oscillator signal 32(Q) at the frequency f2 at a second input. In order to ensure that no parasitic signals from the quadrature mixer 30 are injected back to the voltage controlled oscillator 12, the polyphase filter circuit 24 includes an isolation buffer with respect to each of the first and second parts 24(+45) and 24(−45), respectively.

The in-phase (I) local oscillator signal 32(I) and quadrature phase (Q) local oscillator signal 32(Q) at the frequency f2 are generated from the signal 16 at frequency f1 by a digital divider circuit 40. The divider circuit 40 receives the voltage controlled oscillator 12 output signal 16 and divides that signal by P (wherein P can have any selected integer value greater than one, and in an exemplary embodiment has a value of two, such that f2=f1/P). The divider circuit 40 not only divides the voltage controlled oscillator 12 output signal 16 by P, but it also produces divided in-phase (I) and quadrature phase (Q) components 42(I) and 42(Q), respectively, at the frequency f2 which are used for the in-phase (I) local oscillator signal 32(I) and quadrature phase (Q) local oscillator signal 32(Q) as applied to the quadrature mixer 30.

Each of the mixer components 30(I) and 30(Q) generates a mixer output signal 38(I) and 38(Q), respectively, which are then summed by a summation circuit 46 to produce an output signal 48 having a first image component at the frequency f1+f2 (an upper sideband) and a second image component at the frequency f1−f2 (a lower sideband). In an embodiment of the invention, the summation circuit 46 rejects the image at f1−f2 (i.e., the lower sideband) such that the output signal 48 includes only the image at f1+f2 (i.e., the upper sideband). In this way, the quadrature mixer 30 is implemented as a single sideband (in this case, upper sideband) mixer. It will be further understood that other higher order mixing products may still be present in the output signal 48.

In one embodiment, the circuit 10 further includes a selection circuit 50 which receives the in-phase (I) and quadrature phase (Q) components 42(I) and 42(Q), and then selects which of those signals is to be the in-phase (I) local oscillator signal 32(I) and which of those signals is to be the quadrature phase (Q) local oscillator signal 32(Q). The operation of the circuit 50 allows for control to be exercised over the sign of the phase shift in f2 relative to the f1 signals at the mixer components 30(I) and 30(Q) and thus select whether the upper or lower sideband will be dominant in the output signal 48 generated by the summation circuit 46.

The use of a single sideband mixer advantageously assists the circuit in rejecting spurious response (or unwanted mixing products).

The output signal 48 generated by the summation circuit 46 is applied to a tracking filter 60 to generate a filtered output signal 62. More specifically, the tracking filter 60 is a tunable LC tracking filter. The tracking filter 60 has a selectable resonance frequency fr that in an exemplary implementation is tunable over the range of between about 3.0 and 4.1 GHz. It will, of course, be understood that the selectable resonance frequency of the tracking filter 60 can be designed by one skilled in the art to have any desired frequency range depending on its desired application. The tracking filter center or resonance frequency is adjusted in such a way that minimum insertion loss is assured for any frequency setting adjusted by a phase locked loop (PLL) circuit, to be described herein, within the transmit band. The tracking filter 60 could be implemented as a second or higher order filter using any suitable tunable design known to one skilled in the art.

The tracking filter 60 receives the fine analog voltage tuning signal 14 (also used for fine tuning of the voltage controlled oscillator 12) and functions to set its resonance frequency fr to match the frequency of the output signal 48 generated by the summation circuit 46 (for example, f1+f2 for the upper sideband). The tracking filter 60 further receives a digital calibration signal 64 and operates to coarse tune the matching of resonance frequency fr as a function of the specified digital signal 18 calibration value. As an example, with an analog voltage tuning signal 14 value of 0.5 V, the tracking filter 60 may selectively set its resonance frequency fr over a frequency range of about 2.9 to 4.0 GHz across a plurality of steps (for example, $2^5$ steps for a 5 bit calibration signal) defined by the coarse tuning calibration value of the digital signal 64. With an analog voltage tuning signal 14 value of 1.5 V, on the other hand, the tracking filter 60 may selectively set its resonance frequency fr over a frequency range of about 3.0 to 4.1 GHz across the same plurality of steps defined by the coarse tuning calibration value of the digital signal 64. In a preferred implementation, the tracking filter 60 utilizes a capacitance-based calibrator, like with the voltage controller oscillator 12 (again, for example, using a switched capacitor architecture), to support accurate tuning so as to place the resonance frequency well tuned on the desired frequency of the output signal 48 generated by the summation circuit 46. The generated filtered output signal 62 accordingly has a frequency of f1+f1/P (i.e., f1(P+1)/P).

The use of a tracking filter advantageously assists the circuit in rejecting spurious response (or unwanted mixing products). This is accomplished by adjusting the resonance frequency of the tracking filter to substantially match the wanted frequency (f1±f2), and thus provide additional signal rejection, before any further processing.

The filtered output signal 62 is provided to an output amplifier buffer 66 having a frequency range comparable to the output signal 62 frequency (i.e., the resonant frequency fr of, for example, about 3.2 to 3.8 GHz). The generated buffered output signal 68 can then be used for any selected local oscillator-related purpose. For example, the signal 68 may be used as the local oscillator signal in any selected up/down conversion process, or may be further processed, for example, through a division operation (as shown in FIG. 2) or polyphase filter 85 (generating quadrature signals 68(I) and 68(Q)) to produce the local oscillator signal in any selected up/down conversion process. In an exemplary implementation, the signal 68 is used in a CDMA cellular mobile telephone or other radio frequency communication application.

The voltage controlled oscillator circuit 10 accordingly generates two output signals. The first output signal is the generated buffered output signal 22 at a selectably tunable frequency of f1. The second output signal is the generated buffered output signal 68 at a selectably tunable frequency of f1(P+1)/P. In an embodiment of the invention, P=2 and thus the frequency of the second output signal (signal 68) is one and one-half times (3/2) the frequency of the first output signal (signal 22). These signals accordingly do not have the same frequency and further do not have frequencies which are integer multiples of each other. The voltage controlled oscillator circuit 10 can accordingly be used in a number of applications with minimized risk of spurious mixing products and local oscillator injection pulling.

The voltage controlled oscillator circuit 10 is preferably implemented as an integrated circuit 70 and may be included with other circuitry (not explicitly shown in FIG. 1) in an integrated circuit comprising, for example, an application specific integrated circuit (ASIC). As is well known to those skilled in the art, the circuit 10 has a number of applications which may be fully implemented on an integrated circuit, or may be used with other components, including other integrated circuits and supporting off-chip components, in a system such as in a communications transmitter/receiver application.

When implemented as an integrated circuit 70, the circuit 10 would include an input/output (I/O) interface 72 through which circuitry external to the integrated circuit can communicate with the voltage controlled oscillator circuit 10. As an example, the input/output interface 72 may comprise a serial input output (SIO) circuit. Parallel input/output circuitry could also be used at the expense of additional pins for the integrated circuit 70. Through the I/O interface 72, other circuitry (perhaps external or off-chip) can supply configuration data to the integrated circuit 70. More specifically, in the context of the voltage controlled oscillator circuit 10, the other circuitry could supply the exemplary 5 bit calibration signals used to tune the setting of the frequency f1 generated by the voltage controlled oscillator 12 and the resonance frequency fr for the tracking filter 60. These signals are received and processed by a digital state machine 71 configured to autonomously perform frequency centering. Through the SIO circuit interface 72 the state machine 71 is enabled for operation, and when calibration is completed the state machine automatically disables. Additionally, through the I/O interface 72 the other circuitry can supply enable control signals with respect to the operation of the voltage controlled oscillator circuit 10. For example, responsive to enable control data, the other circuitry can exercise enable control over the operation of the buffer amplifiers 20 and 66, the voltage controlled oscillator 12, the P divider circuit 40, the quadrature mixer circuit 30, and the tracking filter 60. Although illustrated separately, the I/O interface 72 could support mixed digital/analog operation and thus include the interface for the analog tuning signal 14 if desired.

Figure 2B:
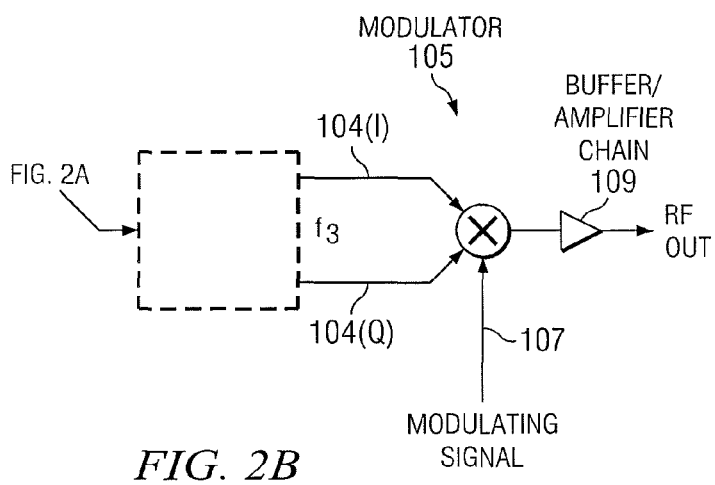
FIG. 2B is a block diagram of a direct conversion transmitter using the circuit of FIG. 2A.
Figure 2A:
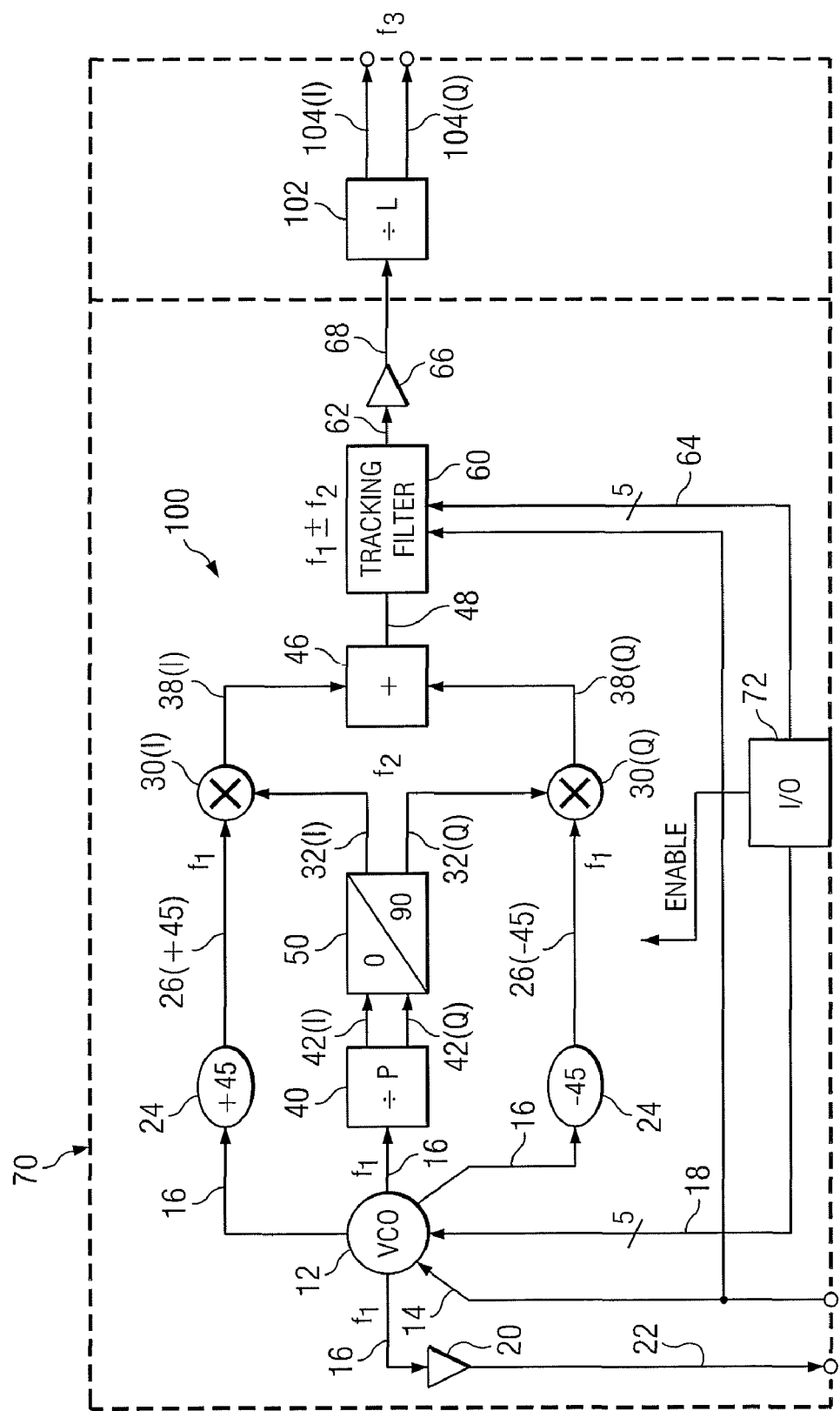
FIG. 2A is a block diagram of another embodiment of a voltage controlled oscillator circuit.

Reference is now made to FIG. 2A wherein there is shown a block diagram of another embodiment of a voltage controlled oscillator circuit 100. The circuit 100 is identical to the circuit 10 shown in FIG. 1 with the exception that the generated buffered output signal 68 is applied to a digital divider circuit 102. The divider circuit 102 receives the generated buffered output signal 68 and divides that signal by L (wherein L can have any selected integer value greater than one). The divider circuit 102 not only divides the generated buffered output signal 68 by L, but it also produces divided in-phase (I) and quadrature phase (Q) components 104(I) and 104(Q), respectively, at a frequency f3=(f1+f1/P)/P/L (i.e., f1(P+1)/PL). The in-phase (I) and quadrature phase (Q) components 104(I) and 104(Q) can, for example, be used as the in-phase (I) and quadrature phase (Q) local oscillator (LO) signals in a communications modulation circuit (such as direct or intermediate frequency down/up conversion circuit for use in a cellular telephone or other radio frequency communication application).

As an example, the signals 104(I) and 104(Q) have an RF frequency f3 and are applied to a quadrature mixer 105 (modulator) which receives a baseband modulating signal 107 in a direct conversion transmitter circuit of well known configuration such as that generally shown in FIG. 2B. The modulator output comprises an RF signal which is amplified/buffered as necessary (perhaps using a chain of controllable gain amplifiers 109).

Although not specifically illustrated in FIG. 2B, it will be understood that the circuit shown in FIG. 2A can further be used in a direct conversion receiver circuit if desired where instead the modulator receiver mixer receives an RF information signal in addition to the quadrature signals 104(I) and 104(Q) and generates a baseband or near-zero IF output signal.

With reference again to FIG. 2A, the digital divider circuit 102 may be included within, or alternatively externally attached to, the integrated circuit 70 of FIG. 1.

The values for P and L should preferably be chosen such that the voltage controlled oscillator frequency f1 and the frequency f3 of the in-phase (I) and quadrature phase (Q) components 104(I) and 104(Q) are not integer multiples of each other. In this way, concerns over local oscillator injection pulling can be substantially eliminated.

Figure 3:
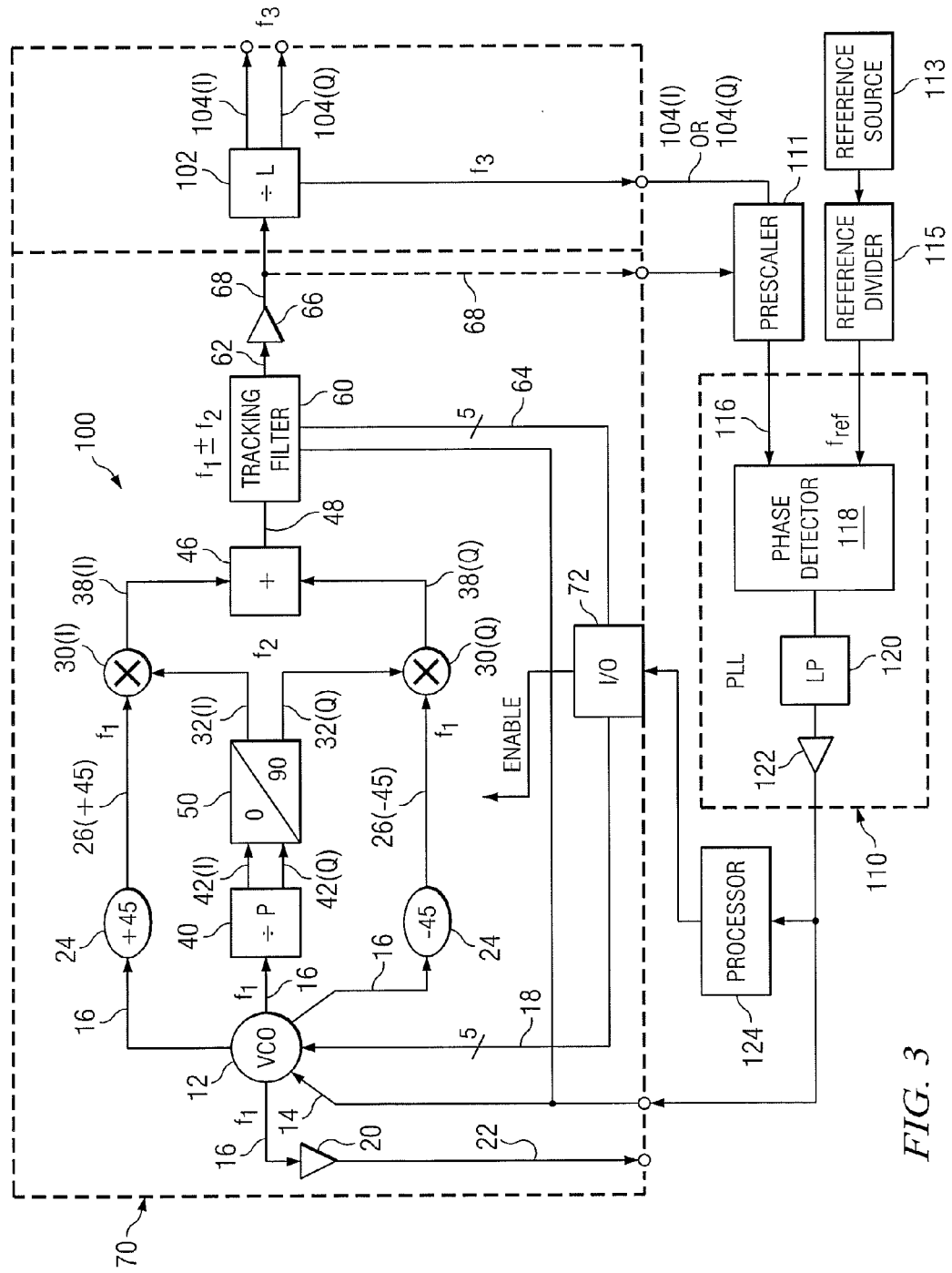
FIG. 3 is a block diagram showing how the voltage controlled oscillator circuit of FIG. 1 can be controlled using a phase lock loop (PLL) architecture.

Reference is now made to FIG. 3 wherein there is shown a block diagram showing how the voltage controlled oscillator circuit 10 (of FIG. 1) can be controlled using a phase lock loop (PLL) architecture. The circuit 10 is configured in the manner shown in FIG. 2 to additionally include the divider circuit 102 to provide in-phase (I) and quadrature phase (Q) components 104(I) and 104(Q), respectively, at a frequency f3=f1(P+1)/PL as the voltage controlled oscillator circuit 100 output signals. One of the in-phase (I) and quadrature phase (Q) components 104(I) and 104(Q) is further output, through a divider 111 to a phase lock loop circuit 110 which has a configuration and operation well known to those skilled in the art. Briefly, the circuit 110 receives a scaled signal 116 derived from the component 104(I)/104(Q) for application as one input to a phase detector 118. The phase detector 118 compares the output signal 116 from the divider 111 to a stable reference frequency signal fref. A resulting voltage signal which represents the difference between the output signal 116 and the stable reference frequency signal (after processing by low pass loop filter 120) is amplified (by amplifier 122) and fed back to the voltage controlled oscillator circuit 10 at least as the analog voltage tuning signal 14 which controls f1 and fr setting in the voltage controlled oscillator 12 and tracking filter 60. The resulting voltage signal may also be interpreted by processing circuitry (generally shown at reference 124) to assist in the generation of the coarse tuning calibration values of the digital signals 18 and 64. In some implementations, the functionalities of the processing circuitry 124 and the state machine 71 may be combined. In the illustrated configuration, the L divider circuit 102 is used to generate any required channel tuning frequency steps with respect to the in-phase (I) and quadrature phase (Q) components 104(I) and 104(Q). The reference frequency fref is generated from a reference frequency source 113 whose output frequency signal is divided by a reference divider 115.

The divider 111 may be implemented to support either or both integer-N and/or fractional-N PLL operation. For integer N PLL operation, the divider 111 divides the received signal by N. Conversely, for fractional-N PLL operation, the divider 111 divides the received signal by N or (N+1) in a manner well known to those skilled in the art. Selection of integer-N and/or fractional-N PLL operation may be made by the processor 124 which suitably controls which of the division operations is performed by the divider 111.

As also shown in FIG. 3, the circuit could alternatively be configured without the divider 102 (i.e., using the circuit of FIG. 1) in which case the output signal 68 from buffer 66 is applied to the divider 111 before application to the PLL circuit 110.

Figure 4:
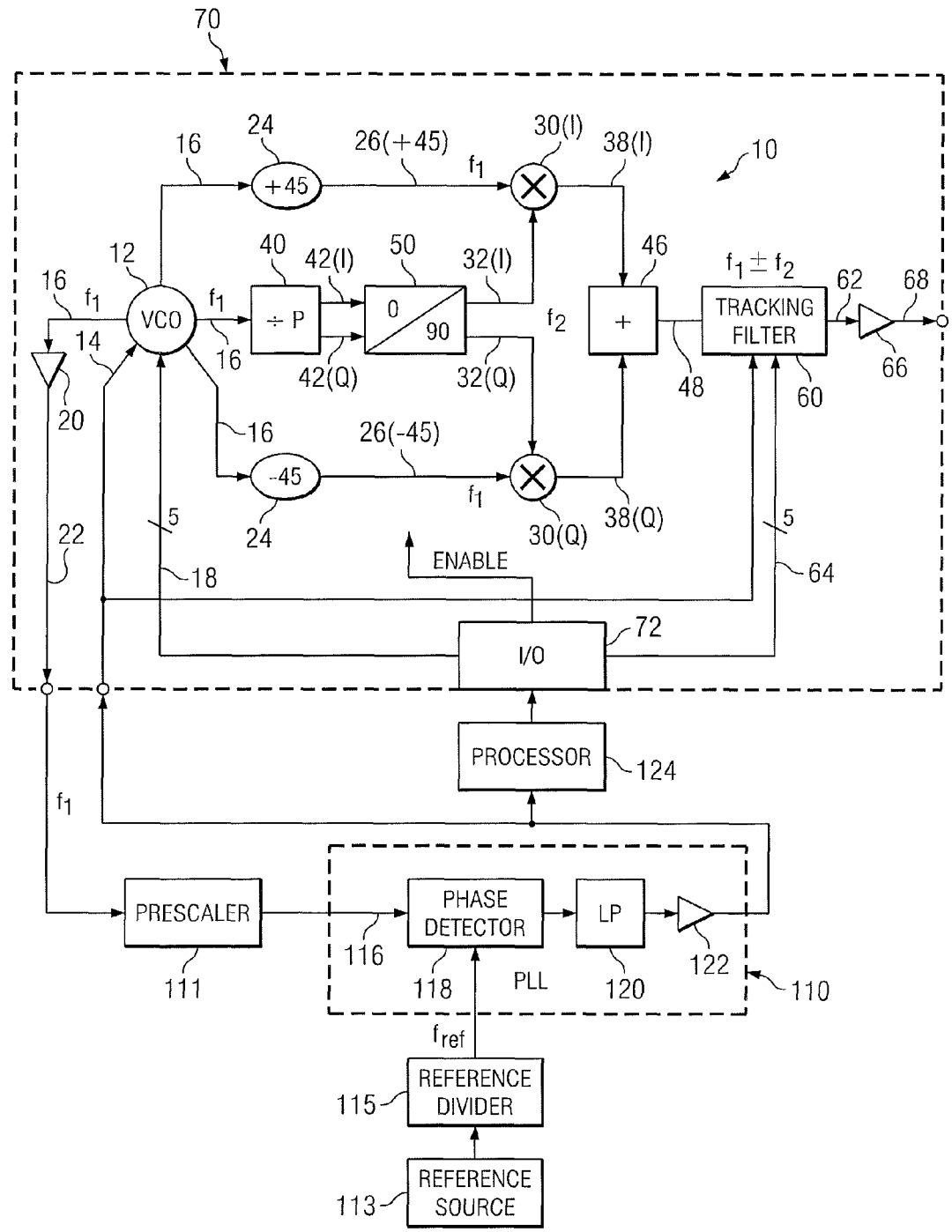
FIG. 4 is a block diagram of another embodiment showing how the voltage controlled oscillator circuit of FIG. 1 can be controlled using a phase lock loop (PLL) architecture.

Reference is now made to FIG. 4 wherein there is shown a block diagram of another embodiment showing how the voltage controlled oscillator circuit 10 (of FIG. 1) can be controlled using a phase lock loop (PLL) architecture. In this embodiment, the circuit 10 is configured in the manner shown in FIG. 1 to generate either or both the buffered output signals 22/68 as the voltage controlled oscillator circuit 10 output(s). The buffered output signal 22 from the voltage controller oscillator 12 is output to divider 111. Again, as with FIG. 3, the divider 111 supports either or both integer-N and/or fractional-N PLL operation and can be processor 124 controlled with respect to operational mode. The phase lock loop circuit 110 has a configuration and operation well known to those skilled in the art. Briefly, the circuit 110 receives the scaled signal 116 (from signal 22) for application as one input to a phase detector 118. The phase detector 118 compares the output signal 116 of the divider 111 to a stable reference frequency signal fref and generates a voltage signal which represents the difference between the output signal 116 and stable reference frequency signal. The voltage signal is processed by low pass loop filter 120 and amplified (by amplifier 122) before being fed back to the voltage controlled oscillator circuit 10 at least as the analog voltage tuning signal 14 which controls f1 and fr setting in the voltage controlled oscillator 12 and tracking filter 60. The voltage signal representative of the phase comparison difference may also be interpreted by processing circuitry (generally shown at reference 124) to assist in the generation of the course tuning calibration values of the digital signals 18 and 64. Again, the functionalities of the processing circuitry 124 and state machine 71 may be combined in selected applications. The reference frequency fref is generated from a reference frequency source 113 whose output frequency signal is divided by a reference divider 115.

It will, of course, be understood that the embodiment of FIG. 4 could alternatively be configured in the manner shown in FIG. 2A to additionally include the divider circuit 102 to provide in-phase (I) and quadrature phase (Q) components 104(I) and 104(Q), respectively, at a frequency f3=f1(P+1)/PL as the voltage controlled oscillator circuit 100 output signals.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A circuit, comprising:
    a single sideband mixer circuit including a voltage controlled oscillator operable at a tunable frequency f1, the mixer circuit outputting a frequency signal at a frequency f1±f2;
    a tracking filter operable to filter the frequency signal output from the mixer circuit and generate a first output signal at the frequency f1±f2 wherein a resonance frequency fr of the tracking filter is tunable in a manner corresponding to changes in tuning of the voltage controlled oscillator so that the resonance frequency fr substantially matches the frequency f1±f2 of the frequency signal; and
    a phase lock loop circuit configured to receive the first output signal and generate frequency control signals for application to said voltage controlled oscillator and tunable tracking filter.

2. The circuit of claim 1 further comprising a first control signal line coupled to a frequency control input of the voltage controlled oscillator and a second control signal line coupled to a frequency control input of the tracking filter, and wherein the first and second control lines are configured to apply first and second frequency control signals, respectively, generated by the phase lock loop circuit for tuning the frequency f1 and the resonance frequency fr.

3. The circuit of claim 2 wherein the first and second control signals are a same control signal.

4. The circuit of claim 2 wherein the first and second frequency control signals are a same control signal.

5. The circuit of claim 1 wherein an input of the tracking filter is directly connected to an output of the single sideband mixer circuit.

6. The circuit of claim 5 wherein the output of the single sideband mixer circuit is a summing node configured to sum an in phase signal with a quadrature phase signal.

7. The circuit of claim 6 wherein the in phase signal is output from an in phase mixer circuit and the quadrature phase signal is output from a quadrature phase mixer circuit, the mixer circuits responsive to phase shifted and frequency divided signals derived from the output of the voltage controlled oscillator.

8. A circuit comprising:
    a single sideband mixer circuit including a voltage controlled oscillator operable at a tunable frequency f1, the mixer circuit outputting a frequency signal at a frequency f1±f2;
    a tracking filter operable to filter the frequency signal output from the mixer circuit and generate a first output signal at the frequency f1±f2 wherein a resonance frequency fr of the tracking filter is tunable in a manner corresponding to changes in tuning of the voltage controlled oscillator so that the resonance frequency fr substantially matches the frequency f1±f2 of the frequency signal;

a first control signal line coupled to a frequency control input of the voltage controlled oscillator and a second control signal line coupled to a frequency control input of the tracking filter, and wherein the first and second control lines are configured to apply first and second control signals, respectively, for tuning the frequency f1 and the resonance frequency fr; and a divider circuit configured to receive the first output signal at the frequency f1±f2 and generate a second output signal at a divided down frequency f3.

9. The circuit of claim 8 further comprising a phase lock loop circuit configured to receive the second output signal and generate the first and second control signals.

10. The circuit of claim 9 wherein the first and second control signals are a same control signal.

11. A circuit, comprising:

a signal generator including a voltage controlled oscillator operable at a tunable frequency, the voltage controlled oscillator configured to output a frequency signal at a frequency f which is a function of the tunable frequency;

a tracking filter operable to filter the frequency signal output from the voltage controlled oscillator and generate an output signal at the frequency f wherein a resonance frequency fr of the tracking filter is tunable with changes in tuning of the voltage controlled oscillator to substantially match the frequency f of the frequency signal; and a phase lock loop circuit configured to respond to the first output signal and generate a first frequency control signal for application to control tuning of said voltage controlled oscillator and a second frequency control signal for application to control tuning of said tunable tracking filter.

12. The circuit of claim 11 further comprising a control signal line coupled to the voltage controlled oscillator and tracking filter and configured to apply a control signal for tuning the tunable frequency and the resonance frequency fr.

13. A circuit, comprising:

a mixer circuit including a voltage controlled oscillator operable at a tunable local oscillator frequency f1, the mixer circuit further including quadrature mixers configured to receive the local oscillator frequency f1 and output a frequency signal at a frequency f1±f2; and a tunable tracking filter operable to filter the frequency signal output from the mixer circuit and generate an output signal at an output frequency of either frequency f1+f2 or frequency f1−f2, the tunable tracking filter having a variable resonance frequency fr that changes correspondingly with changes in tuning of the voltage controlled oscillator so that the resonance frequency fr substantially matches the output frequency; and a phase lock loop circuit configured to receive the output signal and generate one or more control signals for controlling tuning of the frequency f1 and the resonance frequency fr.

14. The circuit of claim 13 further comprising a first control signal line coupled to a frequency control input of the voltage controlled oscillator and a second control signal line coupled to a frequency control input of the tunable tracking filter, and wherein the first and second control lines are configured to apply first and second control signals, respectively, for tuning the frequency f1 and the resonance frequency fr.

15. The circuit of claim 14 wherein the first and second control signals are a same control signal.

16. The circuit of claim 13 wherein an input of the tracking filter is directly connected to an output of the mixer circuit.

17. The circuit of claim 16 wherein the output of the mixer circuit is a summing node configured to sum an in phase signal with a quadrature phase signal.

18. The circuit of claim 17 wherein the in phase signal is output from an in phase mixer circuit and the quadrature phase signal is output from a quadrature phase mixer circuit, the mixer circuits responsive to phase shifted and frequency divided signals derived from the output of the voltage controlled oscillator.

* * * * *